United States Patent [19]

Sawaki et al.

[11] Patent Number: 4,912,503
[45] Date of Patent: Mar. 27, 1990

[54] IMAGE FORMING MACHINE

[75] Inventors: Yukichi Sawaki, Gifu; Kenji Sakakibara, Ichinomiya; Yoichi Horaguchi, Nagoya, all of Japan

[73] Assignee: Brother Kogyo Kabushiki Kaisha, Aichi, Japan

[21] Appl. No.: 187,014

[22] Filed: Apr. 27, 1988

[30] Foreign Application Priority Data

Apr. 28, 1987 [JP] Japan .................................. 62-105841
Jun. 24, 1987 [JP] Japan .............................. 62-97074[U]

[51] Int. Cl.$^4$ ........................ G03B 27/72; G03B 27/76
[52] U.S. Cl. ............................................. 355/35; 355/40; 355/41
[58] Field of Search .............................. 355/35, 40, 41

[56] References Cited

U.S. PATENT DOCUMENTS

| | | | |
|---|---|---|---|
| 2,821,124 | 1/1958 | Enright | 355/40 |
| 3,709,601 | 1/1973 | Zahn et al. | 355/35 |
| 3,768,903 | 10/1973 | Steinberger et al. | 355/41 |
| 4,012,122 | 3/1977 | McVeigh | 355/40 |
| 4,629,312 | 12/1986 | Pearce et al. | 355/41 |

*Primary Examiner*—Monroe H. Hayes
*Attorney, Agent, or Firm*—Oliff & Berridge

[57] ABSTRACT

An image forming or recording machine such as a color copy machine, a color printer, etc. comprises an input unit for inputting or setting selectively various color image forming conditions or data and a color image condition recording unit for recording the conditions input from the input unit on a recording medium for a normal recording operation or for a special image condition recording operation.

7 Claims, 6 Drawing Sheets

IMAGE FORMING MACHINE

BACKGROUND OF THE INVENTION

This invention relates to an image forming or recording machine such as a copy machine, a printer and the like.

A certain conventional image forming machine has a mechanism for changing various data such as color balance( contrast of color), density of images, pitch of dots or the like when an image is output.

The conventional image forming machine normally includes a keY panel (board) provided with a plurality of kevs or push buttons inputting various data or information for forming images different in color balance, density of images and the like. An operator can set image forming or recording conditions, factors or data by operating the keys or push buttons when an original is copied. The image forming condition, factors or data are stored in memories assembled in the machine.

In such a conventional image forming machine, however, some trials (preliminary copying operations) must be repeated while changing the above various data in order to obtain a desirable image.

When the trials are carried out, an operator inputs the data into the machine according to his memory, experience and perception or he inputs the data therein while seeing a memorandum on which desirable data are written with respect to the same original which was formerly copied.

It is some to carry out some trials whenever a new original is copied. If a memorandum is left after the trials, trials are not necessary with respect to the same original. However, it is troublesome to write down the optimum conditions on a sheet of paper.

SUMMARY OF THE INVENTION

It is an object to provide an image forming or recording machine which can record various image forming condtions, factors or data corresponding to a certain original to be copied in order to obtain a desirable image.

According to this invention, there is provided an image forming or recording apparatus for outputting an image, which comprises: a) an input means for inputting various image forming conditions or data such as density of images, color balance, pitch of dots or the like; and (b) an image condition recording means which is operated by signals so that the color image forming conditions are recorded on a recording medium.

The nature, utility, and further feature of this invention will be more olearly apparent from the following detailed description with respect to preferred embodiments of the invention when read in conjunction with the accompanying drawings briefly described below.

DETAILED DESCRIPTION OF THE INVENTION

Figure 1:
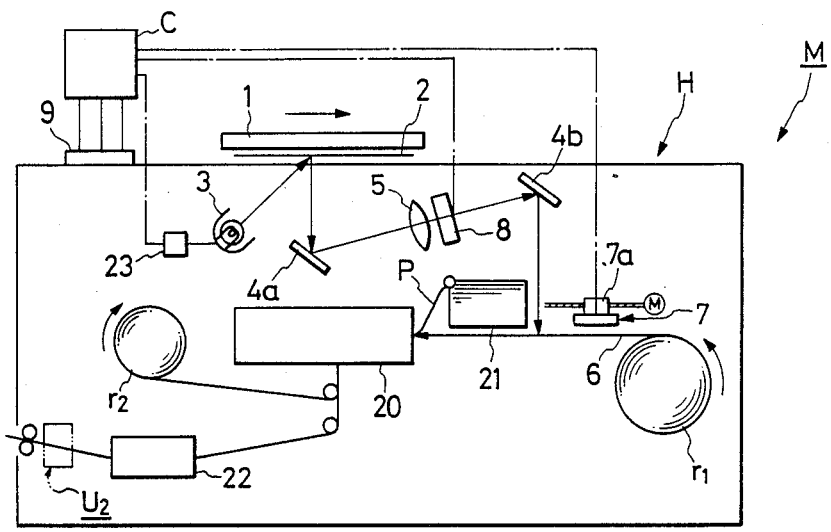
FIG. 1 is a schematic structural view of a copy machine according to invention.
Figure 2:
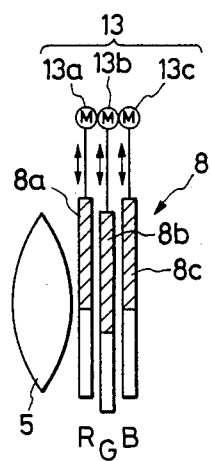
FIG. 2 is a schematic view showing a structure of a filter unit.

FIG. 1 shows an image forming machine M such as a color copy machine. The machine has a housing H whose upper face is provided with a movable original table I for holding an original 2 to be copied. The original 2 is lit by a ligh,t source 3 through a slit with a certain width for limiting a light path. Two mirrors 4a, 4b are provided for changing the direction of a light path and a lens 5 is provided between the two mirrors for concentrating rays of light reflected from the mirror 4a. Adjacent the lens 5 is disposed a filter unit 8 for adjusting color balanoe or contrast of image color. Light rays reflected from the mirror 4b form an Image on a photosensitive pressure-sensitive sheet of paper or a microcapsule sheet 6 (as disclosed in U.S. Pat. Nos. 4,440,846 and 4,399,209) moved synchronously with the movement of the original table 1 in the direction opposite to the moving direotion of the original table 1. A liquid crystal shutter 7 is disposed within a light path over a running path of the microcapsule sheet 6 so as to move synchronously with the sheet 6 and functions as an image forming condition recording means. The liquid crystal shutter 7 has a moying mechanism 7a such as a ball screW and a motor for rotating the ball screw, which moves the shutter 7 synchronously with the sheet 6.

In the machine M is provided a cassette 21 accommodating a plurality of color developer sheets P which are overlapped on the exposed microcapsule sheet 6 in a pressure roller unit 20 for pressing the two overlapped sheets. The microcapsule sheet 6 is supplied from a feed roller $r_1$ and is wound by a take-up roller $r_2$.

The two overlapped sheets 6, P are separated from each other after they are discharged from the pressure roller unit 20, so that onIy the developer sheet P is sent to a thermal fixing unit 22 for fixing the image on the sheet P under heat. Then, the developer sheet P is discharged from an outlet of the housing H.

The filter unit 8 comprises three red, green and blue filters 8a, 8b and 8c for adjusting color balance or contrast of color by changing an area covering the surface of the lens 5 with each filter. The three filters 8a, 8b, and 8c are connected to three respeotive pulse motors 13a, 13b and 13c for moving each filter independently in the direction perpendicular to the optical axis of the lens 5.

Figure 3:
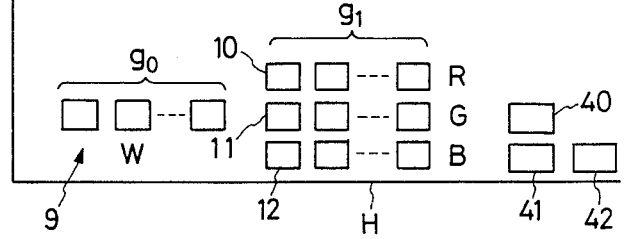
FIG. 3 is a partial plan view of a key panel.

On the upper surface of the housing H of the machine M is, as shown in FIG. 3, disposed an operating panel(key panel) 9 which comprises a group $g_0$ of keys for adjusting density of 1mage, e.g., voltage for the light source a group $g_1$ of keys for moving each filter to adjust color balance, that is, contrast of Image, a start key 40 for starting forming images and two respective mode setting keys 41, 42 for two respective trial and normal operations. Further, in addition to these keys, some other keys may be disposed. The key group g1 has three kinds of keys, that is, a plurality of red keys 10, 10 ... 10, green keys 11, 11 ... 11 and blue keys 12, 12 ... 12. When these keys are pressed, the pulse motors 13 are rotated through predetermined angles corresponding to the keys pressed, respectively, thereby to adjust the color balance of image. If one of the keys of the group $g_0$ is pressed, a dimming circuit 23 for varying voltage is controlled to adjust the amount of light emitted from the light source 3.

The machine M has a microcontroller C therein which functions to control each operating part of the machine M and signals from the key panel 9 are sent to each operating part such as the dimming circuit 23, the filter unit 8, the liquid crystal shutter 7 or the like through the controller C.

The operation of this machine M will now be explained.

Figure 4:
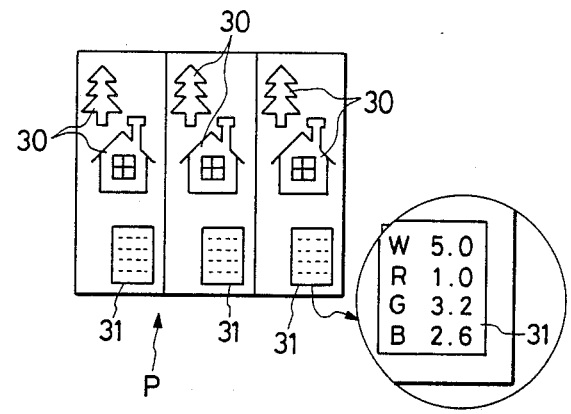
FIG. 4 is a plan view of output images for trials.

First, an operator inputs density of image, color balance, etc., by pushing the various keys on the operating panel 9. With this key operation, the dimming circuit 23 the liquid crystal shutter 7, the filter unit 8 and other parts are controlled. Thereafter, the key 41 for a trial operation is pushed and the start key 40 is then pushed, a part of the original 2 is copied on the developer sheet P. For example, a trial operation is repeated three times and the three images 30 with different density of image and color balance as shown in FIG. 4 are formed adjacent to each other on the same developer sheet P. At the corner of each divided area of the developer sheet P is disposed an image forming condition recording portion 31 in which density W of image and color balance R, G and B of Red, Green and Blue are indicated. The numeral of the density W indicates level of voltage of the light source 3 and each numeral of R, G and B indicates the rate of area of the lens 5, covered with each color filter.

The trial operation is carried out in the following manner.

When the key 41 for trial mode and the start key 40 are pushed, the movable original table 1 is moved by a distance of one-third of a total stroke of the original table 1 and is then returned to its original position. The miorocapsule sheet 6 is also moved by a distance corresponding to the moving distance of the original table 1 synchronously therewith and is stopped at its position. At this time, the liquid crystal shutter 7 is also moved together with the microcapsule sheet 6 in the same direction as that of the microcapsule sheet 6 while forming the image forming conditions input by the key operation on the microcapsule sheet 6. This trial operation is repeated three times. During three trial operations, the microcapsule sheet 6 and the liquid crYstal shutter 7 are moved forward intermittently. After one cycle of an exposure operation is completed, the shutter 7 is returned to its original position while the exposed area of the microcapsule sheet 6 is fed into the pressure roller unit 20 for pressing the microcapsule sheet 6 and the developer sheet P overlapped with each other. Thereafter, the developer sheet P is fed into the thermal fixing unit 22 and is then discharged from its outlet. The discharged or output developer sheet P is shown in FIG. 4.

The operator finds which image is the best while comparing the three images on the output developer sheet P with each other, and acknowledges the image forming conditions corresponding to the best image as the optimum conditions among the three images. Then, the operator operates the keys on the key panel 9 so as to input the optimum image forming conditions into the machine M in order to obtain a predetermined number of desirable output images. Then, the key 42 for a normal recording operation and the start key 40 are pushed to carry out a normal recording operation.

Figure 5:
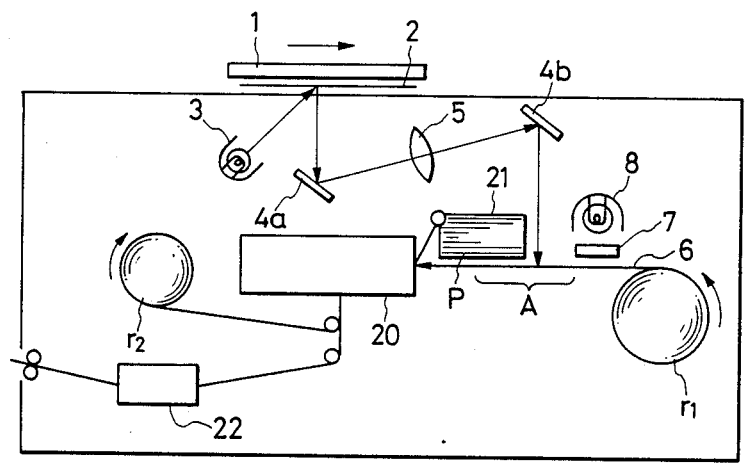
FIG. 5 is a schematic view showing another embodiment of this invention.

In the above embodiment, the liquid crystal shutter 7 is disposed in the light path reflected from the mirror 4b. However, as shown in FIG. 5, the liquid crystal shutter 7 and a supplementary light source 8 for the shutter 7 may be fixedly disposed near the roll $r_1$. In this case, the image forming conditions are recorded on the microcapsule sheet 6 before the sheet 6 reaches a main exposure area A. Further, instead of the liquid crystal shutter 7, a dot printing head may be used to rupture microcapsules. In FIG. 4, three numerals R, G and B are recorded. Instead of the three numerals, one numeral may be recorded on the output sheet P. In this case, three data of R, G and B corresponding to the one output numeral are memorized in a memory. In this manner, if the data corresponding to each numeral are memorized in the memory, the operator inputs only a certain numeral for obtaining a desired image through the keY operation to read the optimum image forming conditions out of the memorv. In addition to the trial operation, the image forming conditions may be recorded on the output developer sheet P during a normal copYing operation.

In this manner, if various image forming conditions are recorded in out put images, it is not necessary to make a memorandum in order to obtain the same images as that output formerly.

In the above embodiment, various image forming conditions are recorded on the sheet with the use of the copYing mechanism and, however, a printing unit for recording various image forming conditions on a sheet of paper may be provided independently of a main copying or recording system for recording images on an original on a recording medium.

Figure 6:
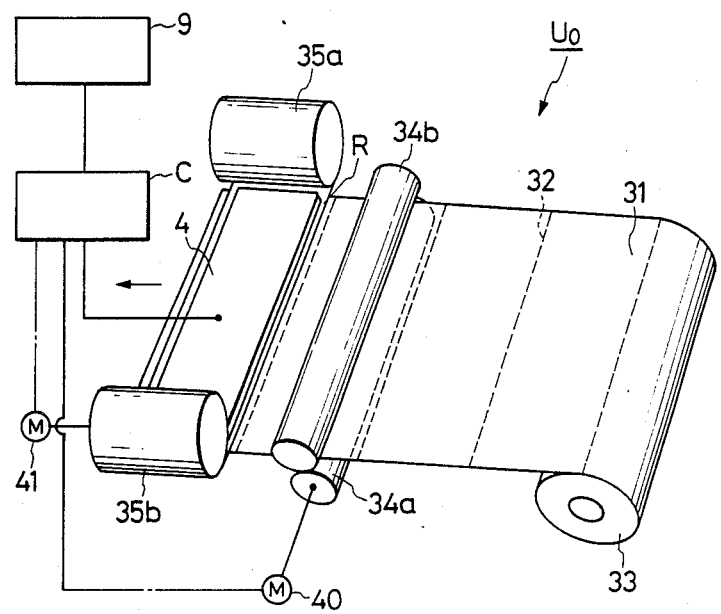
FIG. 6 is a perspective view of a printing unit for printing varions image forming conditions, factors or data.

FIG. 6 shows a printing unit $U_0$ for recording various image forming conditions on a sheet of paper. The printing unit $U_0$ comprises a paper roll 33, a normal continuous recording paper 31 with a series of perforations 32 on which the image forming conditions are recorded, a feed roller 34a, a guide roller 34b cooperating with the feed roller 34a, an ink ribbon feed roller 35a disposed near the feed and guide rollera 34a, 34b, an ink ribbon take up roller 38b for winding a sheet of ink ribbon R extending laterally over the paper 31 and a thermal head 4 disposed over the ink ribbon R. The feed roller 34a and the take-up roller 35b are connected to two pulse motors 40, 41, respectively. These pulse motors 40, 41 and thermal head 4 are controlled by the microcontroller C.

The microcontroller C comprises a CPU 100 and a ROM 102 connected to the CPU via a bus 101 to which a RAM 103 for memorizing signals or the image forming conditions input from the key panel 9 The CPU 100 reads the image forming conditions out of the RAM 103 onoe memorized the conditions. The CPU 100, then, operates the printing unit $U_0$ to output the image forming conditions recorded on the paper 31. When the start key 40 is pushed, a normal recording operation is carried out under the image forming conditions having been input through the key operation. The output of the conditions recorded on the paper 31 may be carried out at any time, that is, at the same time when the normal recording operation is carried out or after or before the normal recording operation.

The bus 101 connects the CPU IOO with the dimming circuit 23, the pulse motors 13a, 13b, and 13c for the filter unit 8, the driving mechanism for the original table 1, and various driving mechanisms for the pressure rollers. heat roller, etc.

Figure 7:
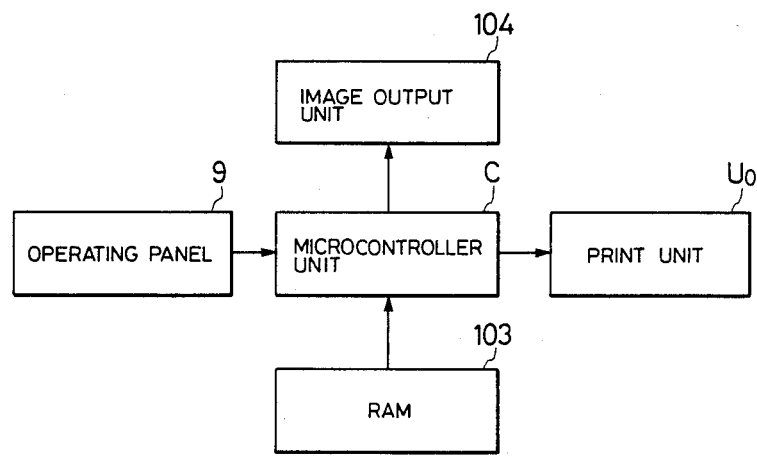
FIG. 7 is a blook diagram showing an image forming system including a step of recording image forming conditions, factors or data.
Figure 8:
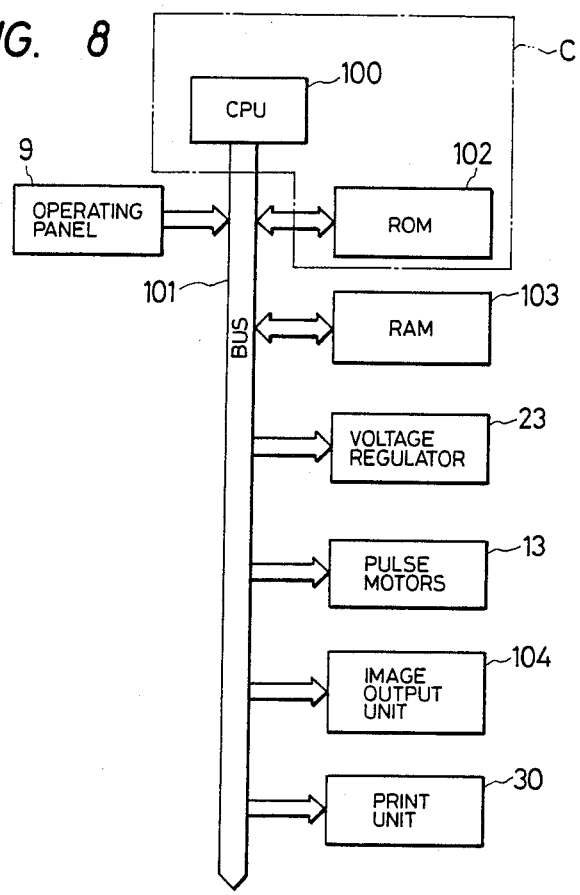
FIG. 8 is a block diagram showing the image forming system described in FIG. 7 in more detail.
Figure 9:
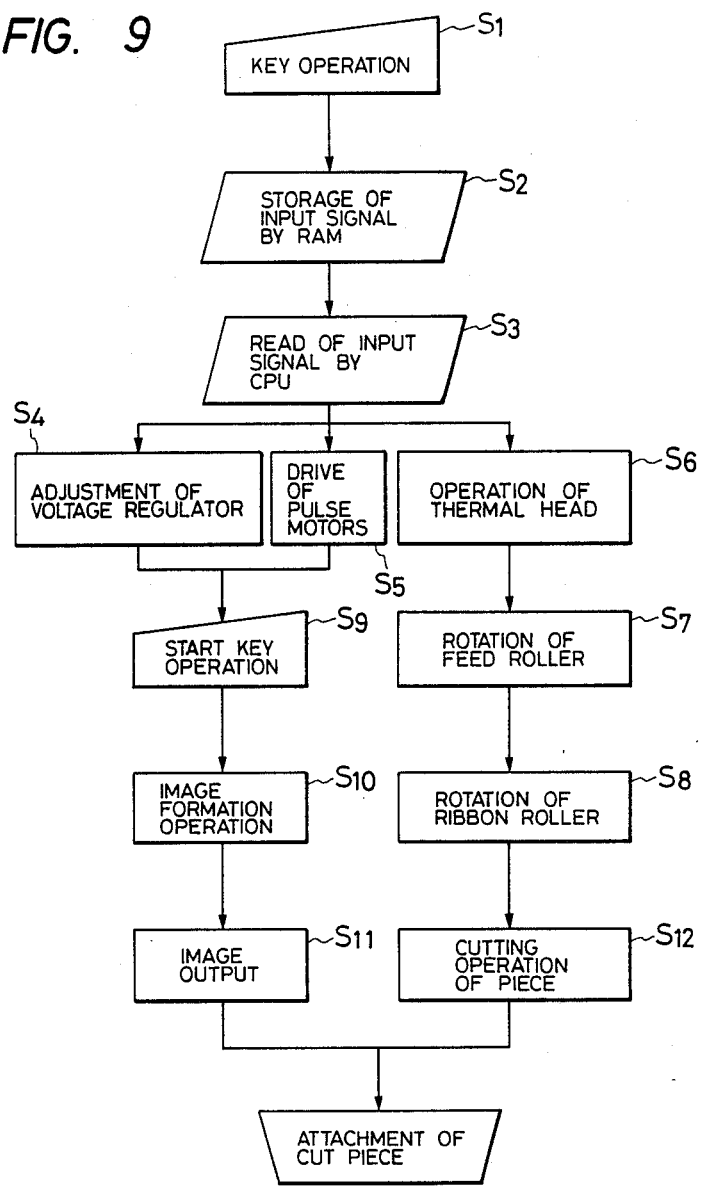
FIG. 9 is a flow chart showing a step for recording various image forming conditions or data on a sheet of paper.

The operation of this invention will now be explained, in more detail, with reference to FIGS. 7 and 9.

The operator pushes the keys on the key panel 9 for inputting data of image density and color balance (Step 2) and the CPU 100 reads the input data out of the RAM 103 (Step 3) to control each operating part of the machine M. That is, the dimming circuit 23 is operated to adjust the voltage of the light source 3 (Step 3). In parallel with this operation of the dimming circuit 28, each pulse motor for the filter unit 8 is operated to cover the surface of the lens 5 at a covering rate with each filter (Step 6).

The CPU 100 operates the thermal head 4 to print the image forming data or conditions, as shown in FIG. 4, on the recording paper 3 (Step G). Thereafter, the feed roller 34a discharges a recorded piece of the paper 31 from an outlet of the unit $U_o$(step 7) and the ink ribbon take up roller 38b rotates to place a new portion of the ink ribbon R under the thermal head 4 (Step 8). Independently of these operations, the start key 40 is pushed to start the normal image forming operation thereby to output the recorded images (Steps 10 and 11). Then, the output piece on which the data are recorded is cut along the aligned perforations 32(step 12).

The cut piece on which the data are recorded is attached by hand, to the back surface of the output developer sheet P on Which the images are recorded (Step 13).

When the operator copies the same original, he inputs the image forming conditions while seeing the data attached to the back surface of the original therebv the same copy can be easilv obtained.

Figure 10:
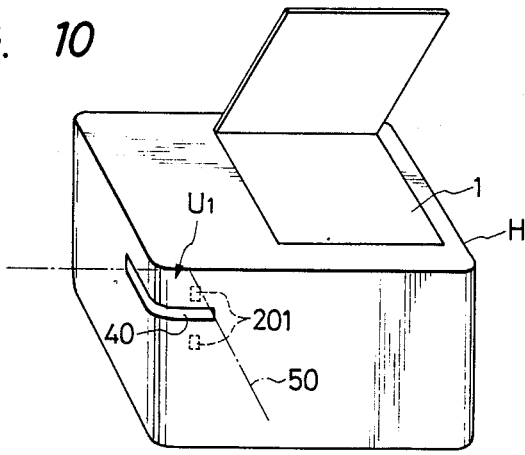
FIG.10 is a perspective view of still another copy machine according to this invention.
Figure 11:
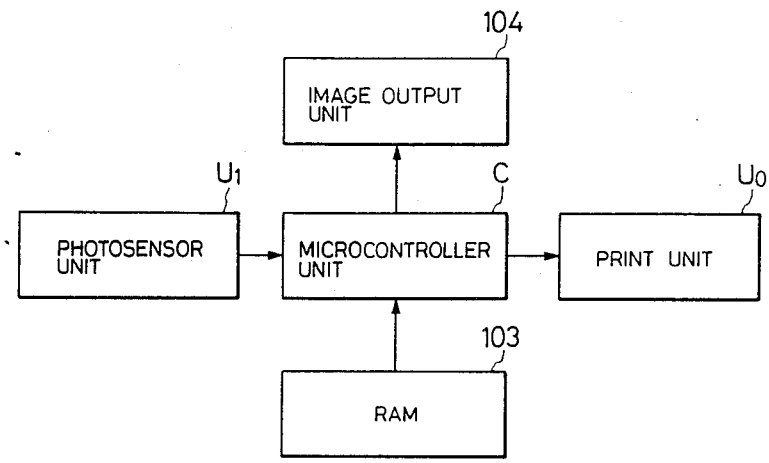
FIG. 11 is a block diagram showing an image forming system of the copy machine shoWn in FIG. 10.

Still another embodiment of this invention will now be described with reference to FIGS. 10 and 11.

A copy machine has a photosensor unit $U_1$ as an input unit which comprises a pair of sensors 201, 201 for above unit $U_0$ shown in FIG. 6 or on the corner of the output developer sheet P. The piece 50 or the corner of the output developer sheet P is inserted through a slit 40 formed at the corner of the housing H. In this embodiment, the photosensor unit $U_1$ is provided instead of the key panel 9 of the above embodiments and other mechanisms and functions are the same as those of FIG. 7. That is, the photosensor unit $U_1$ reads the image forming data to send the data signals to the CPU 100 for controlling every operating part of the copy machine according to the input data.

The thermal head 4 may be replaced with a dot printing head and shape and structure of each part of the machine may be modified within the scope of this invention.

Further, a Unit $U_2$ comprising the thermal head 4,the ink ribbon feed roller 35a, a sheet of ink ribbon R, a take-up roller 36b or the like may be disposed near the outlet of the housing H as shown in FIG. 1 in order to record the image forming conditions on the front or back surface of the developer sheet. In this case, the liquid crystal shutter as an image forming condition recording means is omitted.

As mentioned above, according to this invention, since various image forming data determined when images are output are recorded on recording sheets comprising developer sheets or other kinds of recording sheets, the same originals can be reliably copied or recorded under the same conditions while seeing output recorded data concerning density of images, a color balance, etc. In addition, a memorandum about the image forming conditions is not necessary.

What is claimed is:

1. An image recording apparatus for recording an image corresponding to an original on a developing medium with the use of a photosensitive recording medium, said apparatus comprising:
input means for inputting image forming conditions including at least one of density of images and color balance, said input means outputting image forming condition data;
exposing means for exposing said photosensitive recording medium to light to form a first latent image corresponding to said original;
image forming condition recording means for recording a second latent image of said image forming condition data of said first latent image on said photosensitive recording medium, said image forming condition data being used for varying an image forming condition of said exposing means;
developing means for developing said first and second latent images on said photosensitive recording medium into a visible image on said developing medium; and,
control means for controlling said exposing means and said image forming condition recording means to form a plurality of said first latent images each formed on divided areas of said photosensitive recording medium and based on different image forming condition data and to record said second laten images of said image forming condition data corresponding to said first latent images on the corresponding areas of said photosensitive recording medium.

2. An image recording apparatus according to claim 1, wherein said image forming condition recording means comprises a liquid crystal shutter disposed within a light path for forming said first latent image, said photosensitive recording medium being movable along a running path, and said liquid crystal shutter being movable synchronously with the movement of said photosensitive. recording medium.

3. An image recording apparatus according to claim 1, wherein said image forming condition recording means comprises a liquid crystal shutter fixedly disposed over a running path of said photosensitive recording medium, and a supplemental light source for exposing said photosensitive recording medium through said light crystal shutter.

4. An image recording apparatus according to claim 1, wherein said input means comprises key means for setting said image forming conditions.

5. An image recording apparatus for recording an image corresponding to an original on a developing medium with the use of a photosensitive recording medium, said apparatus comprising:
input means for inputting image forming conditions including at least one of density of images and color balance, said input means outputting image forming condition data;

exposing means for exposing said photosensitive recording medium to light to form a latent image corresponding to said original;

image forming condition recording means for recording said image forming condition data on a recording paper separate from the photosensitive recording medium, said image forming condition being used for varying an image forming condition of said exposing means; and developing means for developing said latent image on said photosensitive recording medium into a visible image on said developing medium.

6. An image recording apparatus according to claim 5, wherein said image forming condition recording means comprises a thermal print head or a dot impact print head.

7. An image recording apparatus according to claim 5, wherein said input means comprises a photosensor unit for reading image forming condition data indicated on said recording paper.

* * * * *